US009104386B2

(12) United States Patent
Xu

(10) Patent No.: US 9,104,386 B2
(45) Date of Patent: Aug. 11, 2015

(54) SERVER RACK SYSTEM AND SERVER

(71) Applicants: Inventec (Pudong) Technology Corporation, Shanghai (CN); INVENTEC CORPORATION, Taipei (TW)

(72) Inventor: Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 398 days.

(21) Appl. No.: 13/776,005

(22) Filed: Feb. 25, 2013

(65) Prior Publication Data
US 2014/0078657 A1 Mar. 20, 2014

(30) Foreign Application Priority Data

Sep. 18, 2012 (CN) .......................... 2012 1 0348079

(51) Int. Cl.
*G06F 1/18* (2006.01)
*G06F 1/26* (2006.01)
*H05K 7/14* (2006.01)

(52) U.S. Cl.
CPC ................ *G06F 1/189* (2013.01); *G06F 1/183* (2013.01); *G06F 1/26* (2013.01); *H05K 7/14* (2013.01); *H05K 7/1411* (2013.01); *H05K 7/1485* (2013.01)

(58) Field of Classification Search
CPC ............. G06F 1/18; G06F 1/189; G06F 1/26; G06F 1/183; G06F 1/185; G06F 1/186; G06F 1/187; H05K 7/1485; H05K 7/20709; H05K 7/23; H05K 7/14; H05K 7/1411
USPC ......... 361/715, 720, 679.01, 679.6, 725, 726, 361/727, 724, 679.02; 312/223.1, 223.2
See application file for complete search history.

(56) References Cited

U.S. PATENT DOCUMENTS

| 6,282,087 | B1 * | 8/2001 | Gibbons et al. | 361/679.32 |
| 6,310,783 | B1 * | 10/2001 | Winch et al. | 361/797 |
| 2010/0259884 | A1 * | 10/2010 | Wang et al. | 361/679.33 |
| 2010/0265650 | A1 * | 10/2010 | Chen et al. | 361/679.33 |

* cited by examiner

*Primary Examiner* — Dion R Ferguson
*Assistant Examiner* — Mandeep Buttar
(74) *Attorney, Agent, or Firm* — Locke Lord LLP; Tim Tingkang Xia, Esq.

(57) ABSTRACT

The server rack system includes multiple the servers, a central power supply module and an integrated network controller module. Each of the servers includes a case, multiple motherboard modules and a connector module. The case has an accommodating space. The motherboard modules are disposed side by side in the accommodating space. Each of the motherboard modules has a power port and a network portal. The connector module has a power distribution circuit and a network distribution unit. The power distribution circuit is electrically connected to each of the power ports. The network distribution unit is connected to each of the network portals. The power distribution circuit is electrically connected to the central power supply module. The network distribution unit is connected to the integrated network controller module for managing the data exchange information between each of the motherboard modules and the integrated network controller module.

12 Claims, 4 Drawing Sheets

SERVER RACK SYSTEM AND SERVER

CROSS-REFERENCE TO RELATED APPLICATIONS

This non-provisional application claims priority under 35 U.S.C. §119(a) on Patent Application No(s). 201210348079.8 filed in China, P.R.C. on Sep. 18, 2012, the entire contents of which are hereby incorporated by reference.

BACKGROUND OF THE INVENTION

1. Technical Field of the Invention

The disclosure relates to a server rack system and a server, more particularly to a server rack system and a server having higher computational density and higher storage density.

2. Description of the Related Art

Sever is a core computer for serving each of the computers in a network system and for providing functions such as disk and printing service required by network users. Server also enables the users to share different resources in a network environment. The basic framework of a server is generally similar to that of a common personal computer. That is, the server includes a central processing unit, memory and input and output devices. The previously mentioned components are connected through buses inside the server. The central processing unit and memory are connected to each other through a northbridge chip, and the input and output devices are connected to each other through a southbridge chip.

Currently, a server exterior appearance is usually designed based on a single standard for using with a server rack system. Flat structured server is very common nowadays and it may be pushed inside or pulled away from a rack of a server rack system like a drawer. Thereby, the space may be utilized to the uttermost. Even though the above structures of server and server rack system may accommodate more servers in a same size of space comparing with conventional ones, it is still an objective for manufacturers to provide a means for enhancing the computational density and storage density of a server in order to enhance the overall computing performance.

SUMMARY OF THE INVENTION

In an embodiment, the disclosure provides a server rack system comprising a plurality of servers, a central power supply module and an integrated network controller module. The servers are horizontally disposed in a rack. The central power supply module is configured for obtaining a power from exterior power source and distributing the power to the servers. The integrated network controller module is configured for communicating the network information of the servers. Each of the servers comprises a case, a plurality of motherboard modules and a connector module. The case has an accommodating space and a first lateral side. The motherboard modules are disposed side by side in the accommodating space. Each of the motherboard modules has a power port and a network portal. The connector module has a power distribution circuit and a network distribution unit. The connector module is pluggably disposed on the first lateral side of the case. The power distribution circuit is electrically connected to the power ports of the motherboard modules. The network distribution unit is connected to the network portals of the motherboard modules. The central power supply module and the integrated network controller module are disposed beside the first lateral side of the case. When the server is assembled in the rack, the power distribution circuit is electrically connected to the central power supply module for obtaining the power from the central power supply module and distributing the power to each of the motherboard modules. The network distribution unit is connected to the integrated network controller module for managing the network data of exchange information between the motherboard modules and the integrated network controller module The disclosure further provides a server configured for being assembled in a rack. The rack comprises a central power supply module and an integrated network controller module. The central power supply module obtains a power from exterior power source and distributes the power to the server. The integrated network controller module communicates the network information of the server. The server comprises a case, a plurality of motherboard modules and a connector module. The case has an accommodating space and a first lateral side. The motherboard modules are disposed side by side in the accommodating space. Each of the motherboard modules has a power port and a network portal. The connector module has a power distribution circuit and a network distribution unit. The connector module is pluggably disposed on the first lateral side of the case. The power distribution circuit is electrically connected to each of the power ports of the motherboard modules. The network distribution unit is connected to each of the network portals of the motherboard modules. When the server is assembled in the rack, the central power supply module and the integrated network controller module are disposed beside the first lateral side of the case. Additionally, the power distribution circuit is electrically connected to the central power supply module for obtaining the power from the central power supply module and distributing the power to the motherboard modules. The network distribution unit is connected to the integrated network controller module for managing the network data of exchange information between the motherboard modules and the integrated network controller module.

BRIEF DESCRIPTION OF THE DRAWINGS

The disclosure will become more fully understood from the detailed description given herein below for illustration only, and thus does not limit the present disclosure, wherein.

DETAILED DESCRIPTION

Figure 1:
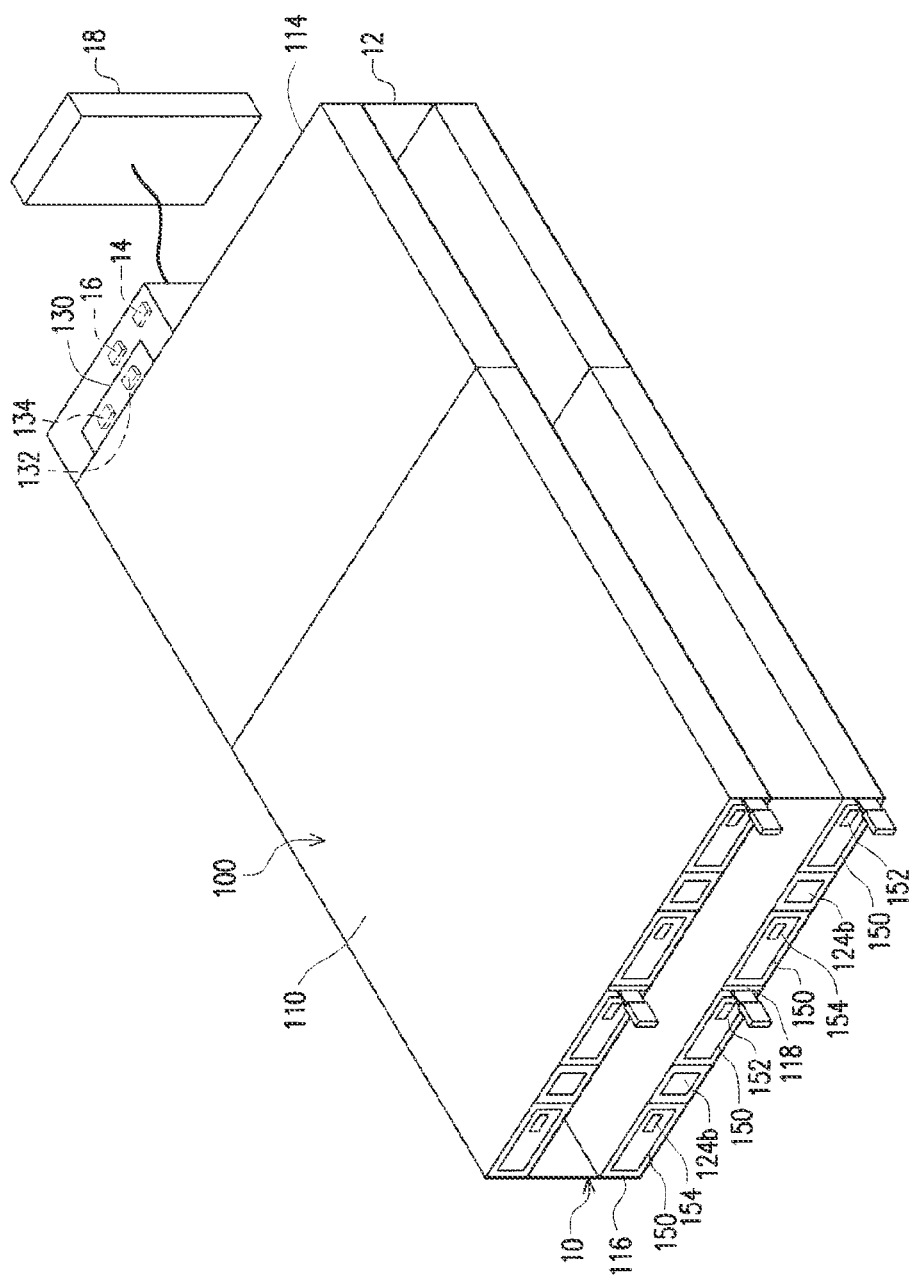
FIG. 1 is a partial perspective view of a server rack system according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a partial perspective view of a server rack system according to an embodiment of the disclosure. In FIG. 1, in order to explicitly show the disposing relationship between servers 100 and a rack 12 in a server rack system 10, only two layers of the rack 12 are illustrated. However, a number of layers and a model of the rack 12 should not be construed as limitations to the disclosure.

Please refer to FIG. 1. The server rack system 10 of this embodiment comprises the rack 12, a central power supply module 14 and an integrated network controller module 16. The central power supply module 14 and the integrated network controller module 16 are disposed at an end of the rack 12. The rack 12 is configured for placing a plurality of the servers 100 inside. The central power supply module 14 obtains a power from exterior power source 12 and distributes the power to the servers 100 disposed in the rack 12. The integrated network controller module 16 communicates the network information of the servers 100 disposed in the rack 12.

Figure 2:
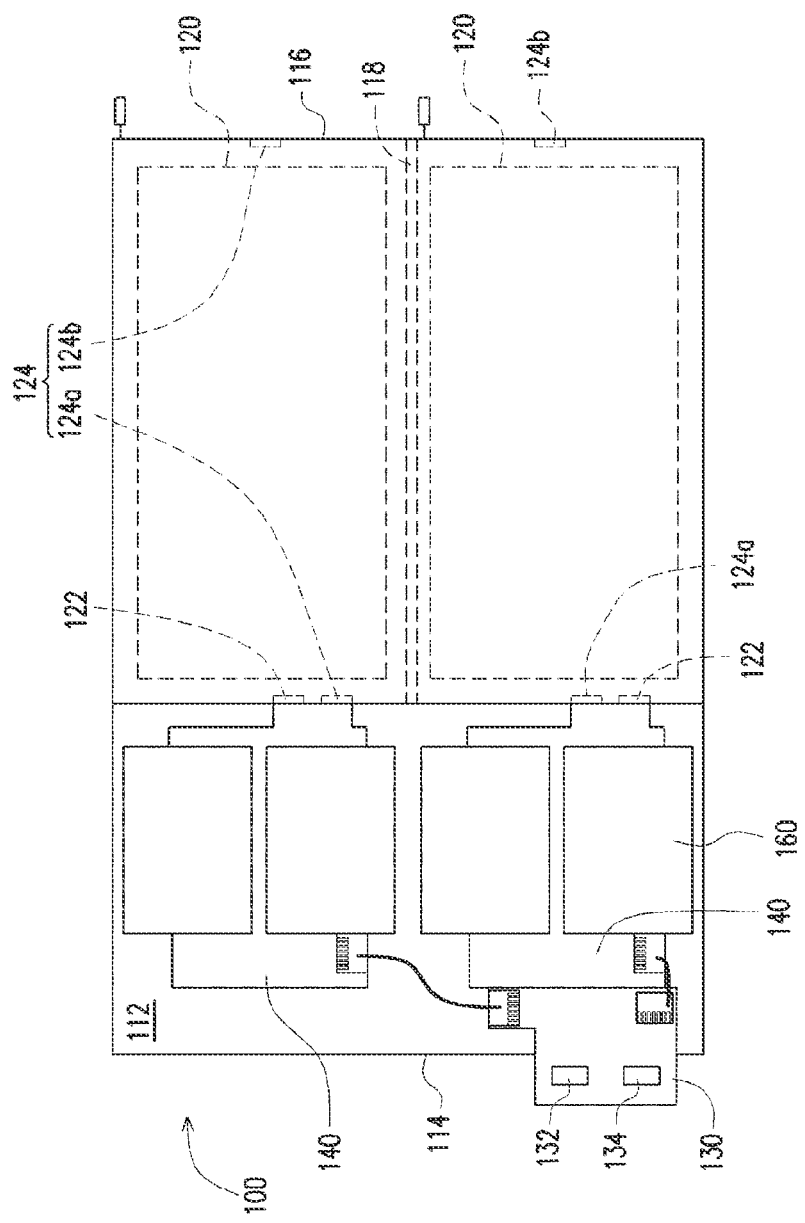
FIG. 2 is a schematic view of an internal configuration of a server according to an embodiment of the disclosure.

FIG. 2 is a schematic view of an internal configuration of the server according to an embodiment of the disclosure. The server 100 of this embodiment is configured for disposing in the server rack system 10. Please refer to FIG. 2, the sever 100 of this embodiment comprises a case 110, a plurality of motherboard modules 120 and a connector module 130. The case 110 has an accommodating space 112 and a first lateral side 114. The motherboard modules 120 are disposed side by side in the accommodating space 112. Each of the motherboard modules 120 has a power port 122 and a network portal 124. The connector module 130 has a power distribution circuit 132 and a network distribution unit 134. The connector module 130 is pluggably disposed on the first lateral side 114 of the case 110. The central power supply module 14 and the integrated network controller module 16 are disposed beside the first lateral side 114 of the case 110. The power distribution circuit 132 is electrically connected to the power ports 122 of the motherboard modules 120. The network distribution unit 134 is connected to the network portals 124 of the motherboard modules 120.

As shown in FIGS. 1 and 2, when the server 100 is assembled in the rack 12, the power distribution circuit 132 of the server 100 is electrically connected to the central power supply module 14 of the server rack system 10 for obtaining the power from the central power supply module 14 of the server rack system 10 and distributing the power to each of the motherboard modules 120 of the server 100. Furthermore, the network distribution unit 134 of the server 100 is connected to the integrated network controller module 16 of the server rack system 10 for managing the network data of exchange information between each of the motherboard modules 120 and the integrated network controller module 16.

Moreover, in this embodiment, the server rack system 10 further comprises a rack management module 18. Each of the network portals 124 of the motherboard modules 120 comprises a network management port 124a. The network distribution units 134 are connected to the network management ports 124a for obtaining the operational status information of the motherboard modules 120 through the network management ports 124a, and collecting and sending the operational status information to the rack management module 18 through the integrated network controller module 16. A user is able to obtain the network information of each of the servers 100 disposed in the rack 12 from the rack management module 18 of the server rack system 10.

Additionally, the network distribution unit 134 in each of the servers 100 of the server rack system 10 identifies an internet protocol address corresponding to the network portal 124 of the motherboard module 120 the network distribution unit 134 is connected to, and receives a data packet sent by the rack management module 18. The network distribution unit 134 further sends out the data packet to the corresponding motherboard module 120 based on the corresponding relationship between the data packet and the internet protocol address.

As shown in FIG. 2, a quantity of the motherboard modules 120 of the server 100 of this embodiment is two, and a width of each of the motherboard modules 120 is approximately half of a width of the case 110 in order that two of the motherboard modules 120 is configured for being placed inside the case 110 at the same time. Nonetheless, in other embodiments, the motherboard modules 120 of a smaller size are configured for being used for placing inside the case 110 of the server 100. Thereby, more of the motherboard modules 120 are configured for being accommodated inside the case 110 for further enhancing the computational density of the server 100.

Furthermore, in this embodiment, the server 100 further comprises a plurality of interconnecting plates 140. The interconnecting plates 140 are disposed in the accommodating space 112 corresponding to the motherboard modules 120. The interconnecting plates 140 are connected to the connector module 130 and the motherboard modules 120 respectively for connecting the power distribution circuit 132 to the power ports 122 of the motherboard modules 120, as well as the network distribution unit 134 to the network portals 124 of the motherboard modules 120. The interconnecting plates 140 are configured for providing the convenience of connecting the motherboard modules 120 to the connector module 130 directly when the motherboard modules 120 are inserted into the case 110. In this embodiment, a quantity of the interconnecting plates 140 corresponds to a quantity of the motherboard modules 120. As shown in FIG. 2, a quantity of the interconnecting plates 140 of the server 100 of this embodiment is two. The interconnecting plates 140 are electrically connected to the connector module 130 through transmission lines, and disposing positions of the interconnecting plates 140 correspond to disposing positions of the motherboard modules 120 when the interconnecting plates 140 are disposed inside the case 110.

Moreover, the case 110 has a second lateral side 116 disposed oppositely to the first lateral side 114. The case 110 further comprises at least one limitation rib 118. The motherboard modules 120 is configured for being slid along the at least one limitation rib 118 from the second lateral side 116 toward the first lateral side 114 respectively to insert into the interconnecting plates 140. As shown in FIG. 2, the limitation rib 118 of this embodiment is disposed between the two motherboard modules 120 in order that the two motherboard modules 120 are configured for being slid along two sides of the limitation rib 118 and inner sides of the case 110 toward the first lateral side 114 to connect with the interconnecting plates 140.

Through the disposition of the limitation rib 118 and the interconnecting plates 140, when the user electrically connecting the motherboard modules 120 to the connector module 130, the complicated steps of opening the first lateral side 114 of the case 110 as well as connecting the transmission lines to the motherboard modules 120 and the connector module 130 may be omitted. Thereby, the convenience of usage is substantially improved.

As shown in FIG. 1, since the central power supply module 14 and the integrated network controller module 16 of this embodiment are disposed inside a same casing, the connector modules 130 of the servers 100 are configured for being electrically connected to the central power supply module 14 and the integrated network controller module 16 simultaneously by connecting to the casing directly. Thereby, the server rack system 10 is configured for providing both power and network information for the servers 100.

Although only two layers of the rack 12 of the server rack system 10 are illustrated in FIG. 1, a number of the layers of the rack 12 should not be construed as a limitation to the disclosure. Each of the layers of the rack 12 can accommodate the server 100 as shown in FIG. 1. In other words, all the servers 100 in the rack 12 may be respectively electrically connected to the central power supply module 14 and the integrated network controller module 16 of the server rack system 10 through the connector modules 130 in order that the server rack system 10 is configured for providing both power and network communication for the servers 100.

When the servers 100 are disposed in the rack 12 of the server rack system 10, the power distribution circuit 132 is electrically connected to the central power supply module 14, and the network distribution unit 134 is connected to the integrated network controller module 16 of the rack 12. Therefore, the server rack system 10 is configured for providing both power and network communication for the servers 100. Also, the dispositions of power and network communication devices are not required inside the cases 110 of the servers 100. Thereby, more space inside the cases 110 of the servers 100 may be available and provided for the motherboard modules 120 or other elements in order to enhance the computational density and performance of the servers 100.

Furthermore, as shown in FIG. 1, each of the servers 100 further comprises a plurality of expansion units 150 electrically connected to the motherboard modules 120 respectively. Each of the expansion units 150 comprises at least one output interface 152 or at least one input interface 154. Each of the output interfaces 152 or each of the input interfaces 154 are exposed on the second lateral side 116 of the case 110. In this embodiment, each of the network portals 124 of the motherboard modules 120 further comprises a network service port 124b and the network service ports 124b are also exposed on the second lateral side 116 of the case 110.

In this embodiment, transmission interfaces of the output interfaces 152 or the input interfaces 154 of the expansion units 150 are serial advanced technology attachment (SATA), integrated drive electronics (IDE), peripheral component interconnect (PCI-E) or universal serial bus (USB). However, the transmission interfaces of the output interfaces 152 or the input interfaces 154 of the expansion units 150 should not be construed as limitations to the disclosure.

In this embodiment, through the dispositions of the output interfaces 152 or the input interfaces 154 on the second lateral side 116, and the dispositions of the connector modules 130 at the first lateral side 114 of the cases 110, when the servers 100 are disposed in the rack 12, the first lateral side 114 of the servers 100 is configured for being pushed inside the rack 12 inwardly. Thereby, the connector modules 130 of the servers 100 is connected to the central power supply module 14 and the integrated network controller module 16 of the server rack system 10 directly. Furthermore, since the output interfaces 152 or the input interfaces 154 of the expansion units 150 are exposed on the second lateral side 116 of the cases 110, the second lateral side 116 is disposed at an outer side of the rack 12 when the servers 100 are disposed in the rack 12. Thereby, it is more convenient for the user to insert external devices into the output interfaces 152 or the input interfaces 154 disposed on the second lateral side 116.

Also, in this embodiment, each of the servers 100 further comprises a plurality of storage units 160. The storage units 160 are disposed inside the case 110 and are electrically connected to the motherboard modules 120. As shown in FIG. 2, some of the storage units 160 are disposed between the first lateral side 114 of the case 110 and the motherboard modules 120. In other words, the storage units 160 are disposed above the interconnecting plates 140. Since a thickness of the interconnecting plates 140 is relatively thin and an excessive space is available above the interconnecting plates 140, the storage capacity of the servers 100 is configured for being enhanced through the disposition of the storage units 160 in the excessive space. As shown in FIG. 2, the storage units 160 disposed above the interconnecting plates 140 are 3.5 inch hard disks and four of the storage units 160 are disposed above the two interconnecting plates 140. Nevertheless, a quantity and type of the storage units 160 should not be construed as limitations to the disclosure.

Figure 3:
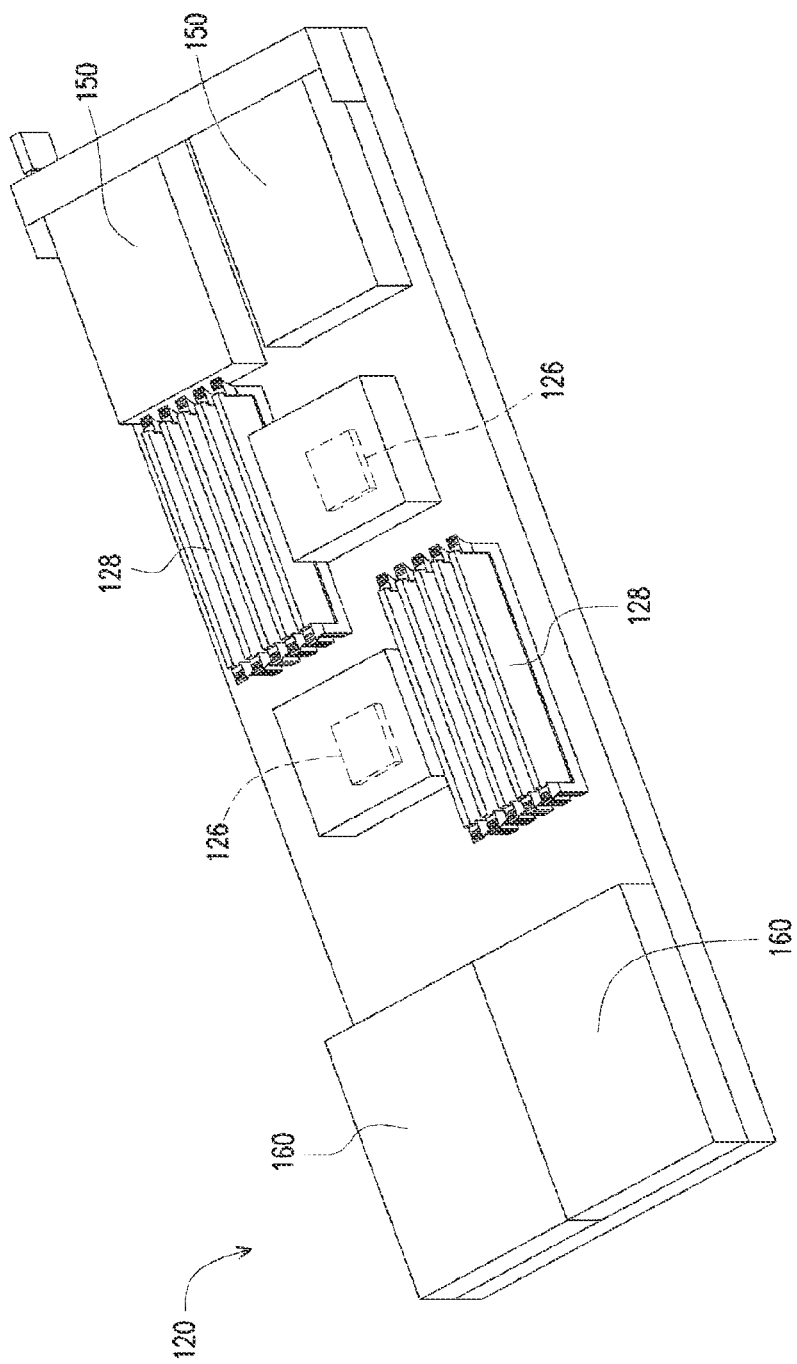
FIG. 3 is a perspective view of one of a plurality of motherboard modules of the server in FIG. 2.
Figure 4:
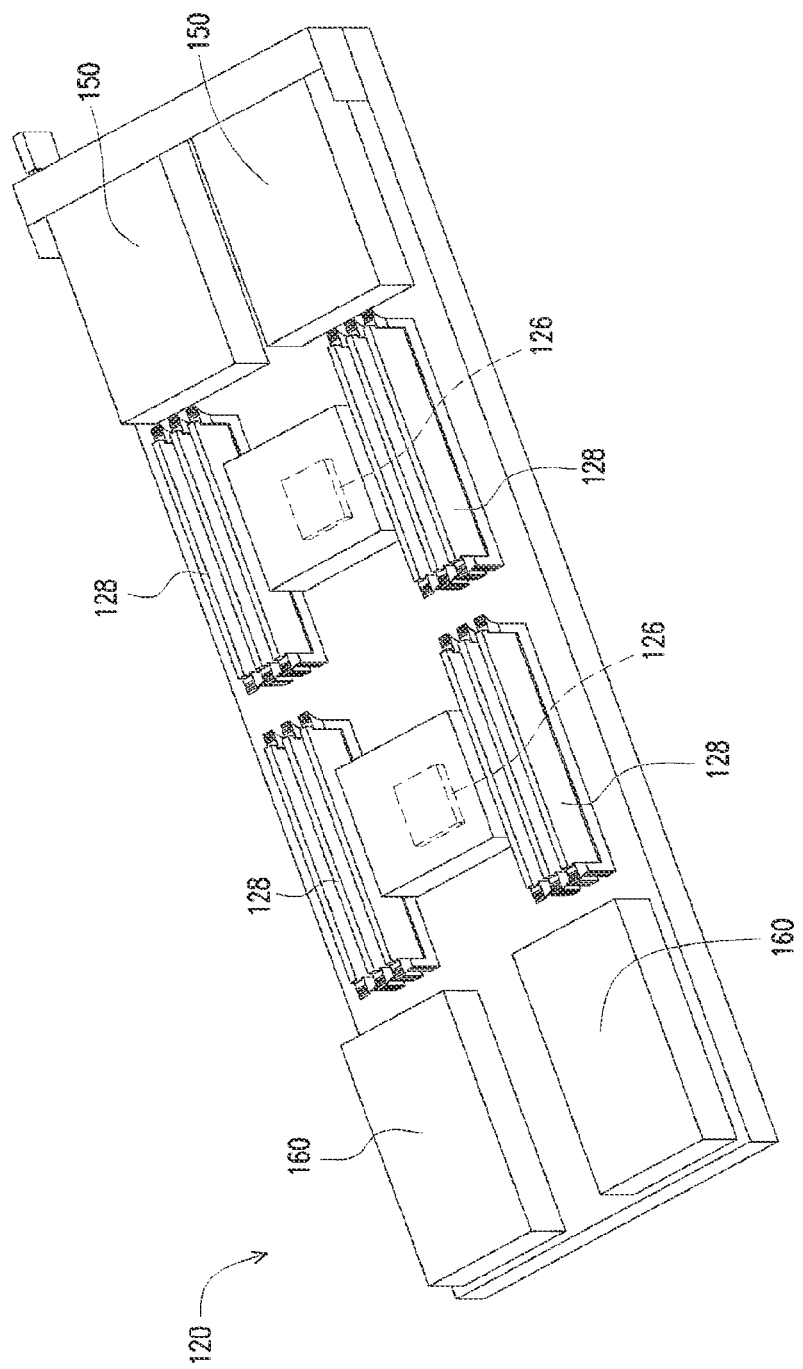
FIG. 4 is a perspective view of another one of the motherboard modules of the server in FIG. 2.

In FIG. 2, the motherboard modules 120 of the servers 100 are covered by the casing. Please refer to FIG. 3 and FIG. 4 in order to understand the disposition of the motherboard modules 120. FIG. 3 is a perspective view of one of the motherboard modules of the server in FIG. 1. FIG. 4 is a perspective view of another one of the motherboard modules of the server in FIG. 1. Each of the motherboard modules 120 comprises at least one heat source 126 and at least one heat dissipation module 128.

In this embodiment, each of the motherboard modules 120 has two of the heat sources 126, and the heat sources 126 are central processing units. Nonetheless, a type of the heat sources 126 should not be construed as a limitation to the disclosure. The heat dissipation modules 128 of this embodiment comprise expansive heat dissipation fins disposed near the heat sources 126 for eliminating the heat produced by the heat sources 126 by thermal contact. The heat sources 126 in FIG. 3 are disposed on the motherboard module 120 in an interlacing arrangement. The two heat dissipation modules 128 are disposed by a side of the two heat sources 126 respectively. The heat sources 126 in FIG. 4 are disposed side by side to each other on the motherboard module 120. The four heat dissipation modules 128 are disposed by two sides of the two heat sources 126 respectively. FIG. 3 and FIG. 4 are merely used for showing the two ways of how the heat sources 126 and the heat dissipation modules 128 are disposed on the motherboard module 120. The way of disposition of the heat sources 126 and the heat dissipation modules 128 on the motherboard module 120 should not be construed as a limitation to the disclosure.

In FIG. 3, the storage units 160 are 3.5 inch hard disks. In FIG. 4, the storage units 160 are 2.5 inch hard disks or solid state drives. But the type and quantity of the storage units 160 should not be construed as limitations to the disclosure. A passage is disposed between the two storage units 160 in FIG. 4 for the heat produced by the heat sources 126 to depart through the passage. Nevertheless, the disposition of the storage units 160 on the motherboard module 120 should not be construed as a limitation to the disclosure.

Additionally, in this embodiment, some of the storage units 160 are disposed by one side of the heat sources 126 and the heat dissipation modules 128 on the motherboard module 120, and the expansion units 150 are disposed by another side of the heat sources 126 and the heat dissipation modules 128 on the motherboard module 120. In other embodiments, however, the storage units 160 may also be disposed by the two sides of the heat sources 126 and the heat dissipation modules 128 on the motherboard module 120. In other words, the expansion units 150 is configured for being replaced by the storage units 160 based on requirements in order to enhance the storage density of the server 100. Nonetheless, the disposing relationship between the storage units 160, the expansion units 150 and the motherboard module 120 should not be construed as a limitation to the disclosure.

As a conclusion, the server rack system of the disclosure obtains the power from exterior power source through the central power supply module and distributes the power to the servers disposed in the rack, and manages the network data of exchange information of the motherboard modules of the servers disposed in the rack through the integrated network controller module. Furthermore, the motherboard modules of the servers of the disclosure are connected to the central power supply module and the integrated network controller module of the server rack system through the connector modules. Therefore, the dispositions of network communication lines and power modules are not required inside the cases of the servers. Thereby, more space inside the cases may be available and provided for the motherboard modules or the storage units in order to enhance the computational density and storage density of the servers. Furthermore, through the disposition of the limitation ribs of the cases of the servers, when the motherboard modules are placed inside the cases, the motherboard modules is configured for being slid along the limitation ribs from the second lateral side toward the first lateral side to insert into the interconnecting plates respectively. Thereby, the motherboard modules are connected to the connector modules for electrically connecting to the central power supply module and the integrated network controller module. The processes of connecting of transmission lines to and disconnecting of transmission lines from the connector modules and the motherboard modules are able to be omitted. Thereby, the convenience of inserting and detaching the motherboard modules is improved.

What is claimed is:

1. A server rack system, comprising:
a plurality of servers horizontally disposed in a rack;
a central power supply module configured for obtaining a power from the exterior power source and distributing the power to the servers respectively; and
an integrated network controller module configured for communicating the network information of the servers respectively;
wherein each of the servers comprises:
a case having an accommodating space and a first lateral side;
a plurality of motherboard modules disposed in the accommodating space side by side, each of the motherboard modules having a power port and a network port; and
a connector module having a power distribution circuit and a network distribution unit, wherein the connector module being pluggably disposed on the first lateral side of the case, the power distribution circuit being electrically connected to the power ports of the motherboard modules, the network distribution unit being connected to the network ports of the motherboard modules;
wherein the central power supply module and the integrated network controller module are both disposed beside the first lateral side of the case, when the server is assembled in the rack, the power distribution circuit is electrically connected to the central power supply module for obtaining the power from the central power supply module and distributing the power to each of the motherboard modules, the network distribution unit is connected to the integrated network controller module for managing the network data of exchange information between the motherboard modules and the integrated network controller module.

2. The server rack system as claimed in claim 1, wherein each of the servers further comprises a plurality of interconnecting plates, the interconnecting plates are disposed in the accommodating space corresponding to the motherboard modules, the interconnecting plates are connected to the connector module and the motherboard modules respectively for connecting the power distribution circuit to the power ports of the motherboard modules, as well as the network distribution unit to the network ports of the motherboard modules.

3. The server rack system as claimed in claim 2, wherein the case has a second lateral side disposed oppositely to the first lateral side, the case further comprises at least one limitation rib, the motherboard modules are configured for being respectively slid along the at least one limitation rib from the second lateral side toward the first lateral side to insert into the interconnecting plates.

4. The server rack system as claimed in claim 1, further comprising a rack management module, each of the network ports of the motherboard modules comprising a network management port, the network distribution units being connected to the network management ports for obtaining the operational status information of the motherboard modules through the network management ports, and collecting and sending the operational status information to the rack management module through the integrated network controller module.

5. The server rack system as claimed in claim 4, wherein the servers further comprise a plurality of expansion units electrically connected to the motherboard modules respectively, each of the expansion units comprises at least one output interface or at least one input interface, the case has a second lateral side disposed oppositely to the first lateral side, each of the output interfaces or each of the input interfaces are exposed to the second lateral side of the case;
wherein each of the network ports of the motherboard modules further comprises a network service port, the network service ports are also exposed to the second lateral side of the case.

6. The server rack system as claimed in claim 4, wherein the network distribution unit in each of the servers identifies an internet protocol address corresponding to the network port of the motherboard module the network distribution unit is connected to, receives a data packet sent by the rack management module, and sends out the data packet to the corresponding motherboard module based on the corresponding relationship between the data packet and the internet protocol address.

7. A server configured for being horizontally assembled in a rack, the rack comprising a central power supply module and an integrated network controller module, the central power supply module obtaining a power exterior power source and distributing the power to the server, the integrated network controller module communicating the network information of the server,
the server comprising:
a case having an accommodating space and a first lateral side;
a plurality of motherboard modules disposed in the accommodating space side by side, each of the motherboard modules having a power port and a network port; and
a connector module having a power distribution circuit and a network distribution unit, the connector module being disposed on the first lateral side of the case, the power distribution circuit being electrically connected to each of the power ports of the motherboard modules, the network distribution unit being connected to each of the network ports of the motherboard modules;
wherein when the server is assembled in the rack, the central power supply module and the integrated network controller module are disposed beside the first lateral side of the case, the power distribution circuit is electrically connected to the central power supply module for obtaining the power from the central power supply module and distributing the power to the motherboard modules, the network distribution unit is connected to the integrated network controller module for managing the network data of exchange information between the motherboard modules and the integrated network controller module.

8. The server as claimed in claim 7, further comprising a plurality of interconnecting plates, the interconnecting plates being disposed in the accommodating space corresponding to the motherboard modules, the interconnecting plates being connected to the connector module and the motherboard modules respectively for connecting the power distribution circuit to the power ports of the motherboard modules, as well as the network distribution unit to the network ports of the motherboard modules.

9. The server as claimed in claim 8, wherein the case has a second lateral side disposed oppositely to the first lateral side, the case further comprises at least one limitation rib, the motherboard modules are configured for being slid along the at least one limitation rib from the second lateral side toward the first lateral side to insert into the interconnecting plates respectively.

10. The server as claimed in claim 7, wherein the rack further comprises a rack management module, each of the network ports of the motherboard modules comprises a network management port, the network distribution units are connected to the network management ports for obtaining the operational status information of the motherboard modules through the network management ports, and collecting and sending the operational status information to the rack management module through the integrated network controller module 11. The server as claimed in claim 10, further comprising a plurality of expansion units electrically connected to the motherboard modules respectively, each of the expansion units comprising at least one output interface or at least one input interface, the case having a second lateral side disposed oppositely to the first lateral side, each of the output interfaces or each of the input interfaces being exposed to the second lateral side of the case;

wherein each of the network ports of the motherboard modules further comprises a network service port, the network service ports are also exposed to the second lateral side of the case.

12. The server as claimed in claim 10, wherein the network distribution unit identifies an internet protocol address corresponding to the network port of the motherboard module the network distribution unit is connected to, receives a data packet sent by the rack management module, and sends out the data packet to the corresponding motherboard module based on the corresponding relationship between the data packet and the internet protocol address.

* * * * *